(12) United States Patent
Tsuchiya

(10) Patent No.: US 6,642,721 B2
(45) Date of Patent: Nov. 4, 2003

(54) METHOD OF MEASURING INSULATION RESISTANCE OF CAPACITOR AND INSULATION RESISTANCE MEASURING APPARATUS OF THE SAME

(75) Inventor: Masamichi Tsuchiya, Tokyo (JP)

(73) Assignee: Tokyo Weld Co., Ltd., Tokyo-To (JP)

(*) Notice: Subject to any disclaimer, the term of this patent is extended or adjusted under 35 U.S.C. 154(b) by 0 days.

(21) Appl. No.: 09/984,922

(22) Filed: Oct. 31, 2001

(65) Prior Publication Data
US 2003/0020486 A1 Jan. 30, 2003

Related U.S. Application Data

(63) Continuation of application No. PCT/JP01/06414, filed on Jul. 25, 2001.

(51) Int. Cl.$^7$ .............................................. G01R 31/12
(52) U.S. Cl. ...................................... 324/548; 324/551
(58) Field of Search ................................ 324/548, 549, 324/551, 658, 691

(56) References Cited

U.S. PATENT DOCUMENTS 5,150,059 A * 9/1992 Bognar et al. ............... 324/551
6,448,525 B1 * 9/2002 Nishioka et al. ............ 209/574

FOREIGN PATENT DOCUMENTS

| JP | 51-107375 | 9/1976 |
| JP | 69-069970 | 3/1989 |
| JP | 03-077073 | 4/1991 |
| JP | 04-131770 | 5/1992 |
| JP | 10-221396 | 8/1998 |
| JP | 10-246746 | 9/1998 |

* cited by examiner

*Primary Examiner*—N. Le
*Assistant Examiner*—Vincent Q. Nguyen
(74) *Attorney, Agent, or Firm*—Birch, Stewart, Kolasch & Birch, LLP

(57) ABSTRACT

An object of the present invention is to easily, quickly and precisely measure an insulation resistance of an capacitor. An insulation resistance measurement apparatus of the present invention includes a variable/constant-voltage power source, voltmeter, intermittent circuit and constant-current supply circuit, constant-current sink circuit, test capacitor, current amplifier, and A/D converter and calculation processor. The intermittent circuit and constant-current supply circuit intermittently output a current based on a voltage supplied from variable/constant-voltage power source. When a constant voltage is intermittently applied to the test capacitor, the current flowing through the test capacitor is amplified by the current amplifier, and subsequently inputted to the A/D converter and calculation processor. The A/D converter and calculation processor convert an analog current measured value to a digital measured value, subject the value to a calculation processing and intermittently output an insulation resistance value. Thereby, the insulation resistance can precisely be measured in a short time.

16 Claims, 13 Drawing Sheets

INSULATION REGISTANCE INTERMITTENT APPLYING/MEASUREMENT CIRCUIT

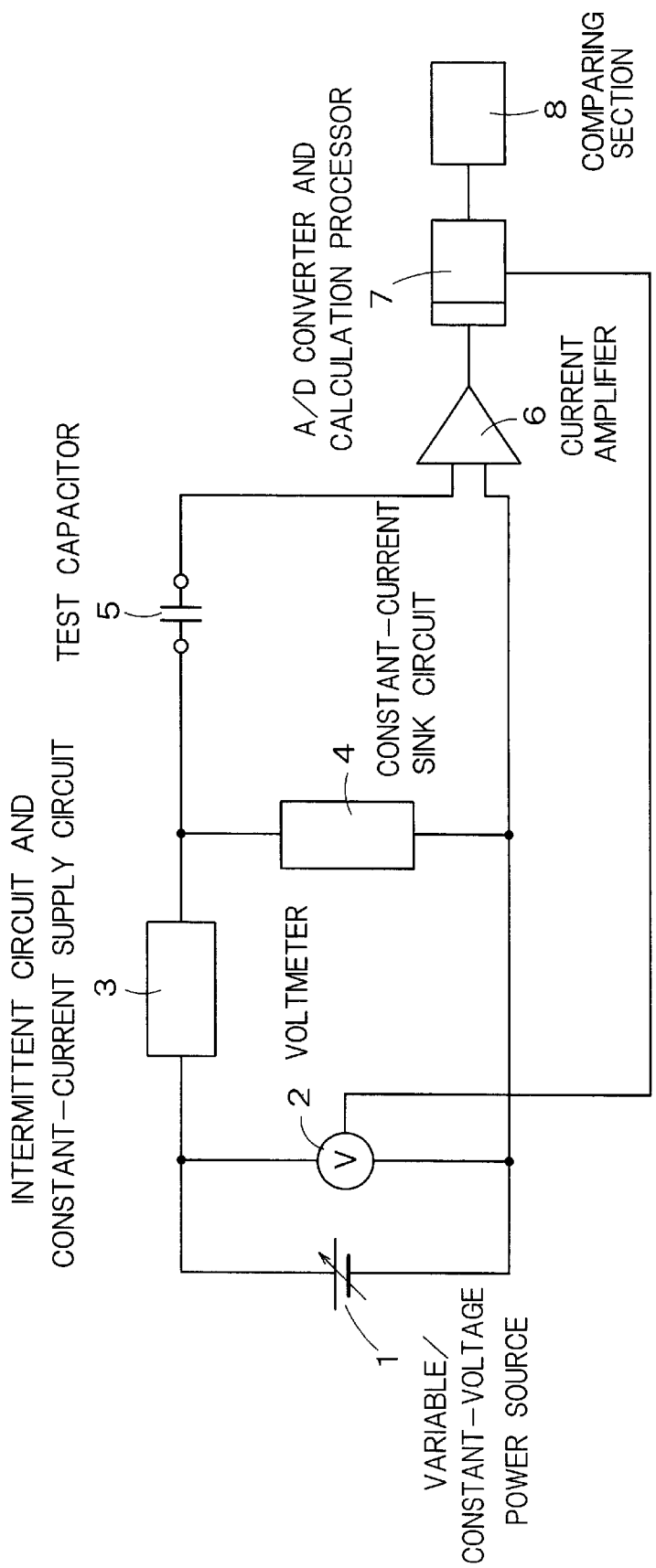
F I G. 1

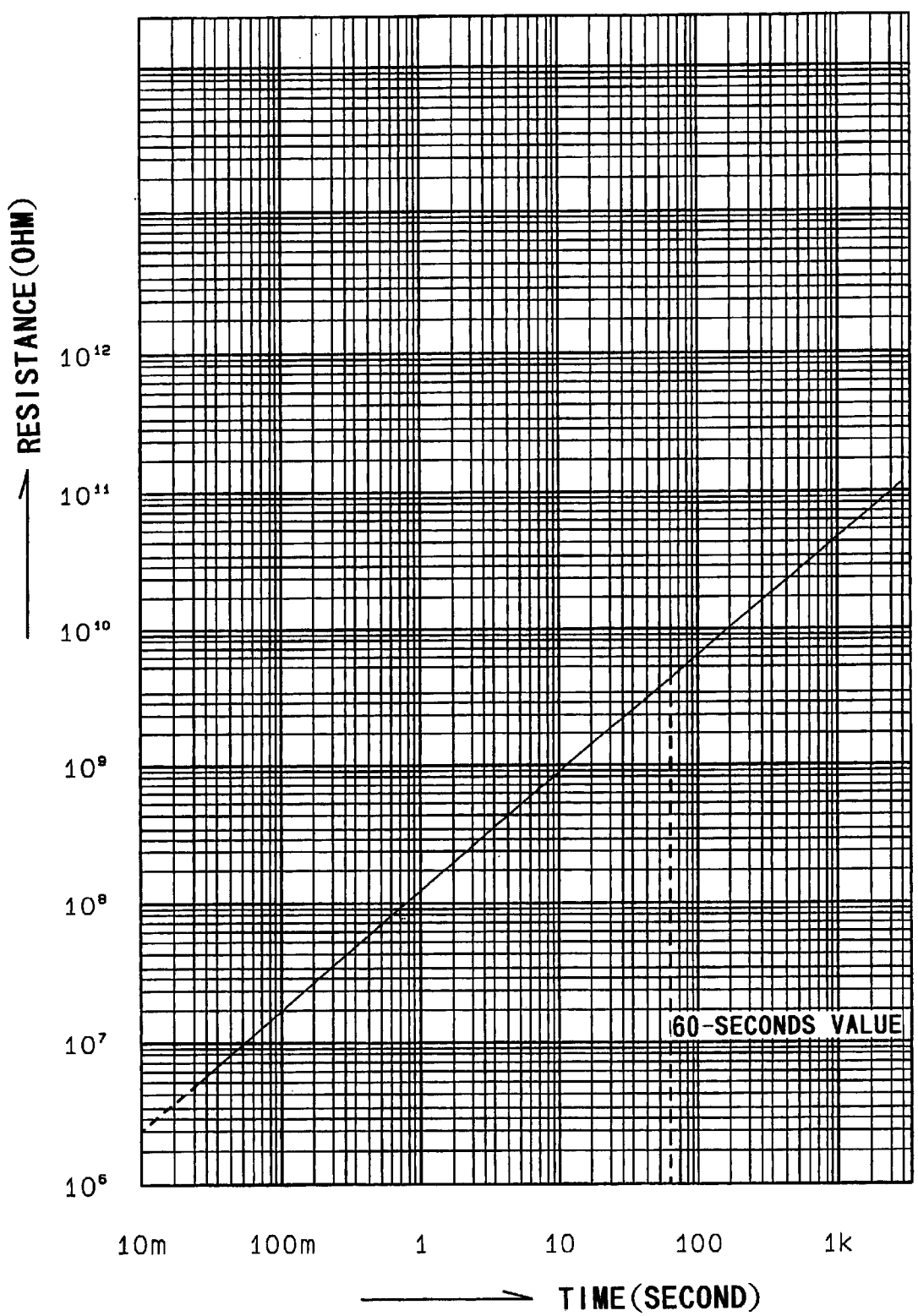
F I G. 2

FROM SEPARATION SUPPLY SECTION

METHOD OF MEASURING INSULATION RESISTANCE OF CAPACITOR AND INSULATION RESISTANCE MEASURING APPARATUS OF THE SAME

This application is a Continuation or copending PCT International Application No. PCT/JP01/06414 filed on Jul. 25, 2001, which was not published in English and which designated the United States, and on which priority is claimed under 35 U.S.C. §120, the entire contents of which are hereby incorporated by reference.

BACKGROUND OF THE INVENTION

1. Field of the Invention

The present invention relates to a method of measuring insulation resistance of a capacitor and an insulation resistance measuring apparatus of the capacitor for measuring an insulation resistance of the capacitor.

2. Related Background Art

In order to compare whether or not an insulation resistance of a capacitor is not normal, there is known a technique which applies a predetermined DC voltage to a capacitor at a state of connecting a current-limiting resistor and measures the insulation resistance of the capacitor based on a leak current of the capacitor measured after a predetermined time.

A conventional insulation resistance measurement system prescribed by JIS C 5102 has been employed and used in measuring the insulation resistance of a work such as the capacitor. In this system, a predetermined measured voltage is applied to the work, and a current flowing through the work is measured after 60±5 seconds.

At present, there is a demand for mass production and high quality in electronic components such as the capacitor, and the demand cannot be satisfied in the conventional technique of measuring the insulation resistance over a time of about 60 seconds per one capacitor.

There has been proposed a work test method for testing and classifying the works by intermittently applying the DC voltage to the works (Japanese Patent No. 2578440). This method is suitable for measuring or testing property of the works contained in a work-pocket disposed at a constant interval along an outer periphery of a turntable, while the turntable is intermittently rotated. More specifically, after the DC voltage is intermittently applied to the work twice, the property of the work is measured and tested, and then the work is discharged.

However, it is difficult to measure the insulation resistance of the work by the method disclosed in the publication. The reason is that a conventional technology has employed a so-called resistance charging method in which the DC voltage is continuously applied to the capacitor at a state of connecting the current-limiting resistor to the capacitor. Therefore, a certain time constant is required for reaching the applied voltage, and a value of the insulation resistance is uncertain particularly at an initial state of applying the voltage.

Moreover, as an insulation resistance measurement method using the turntable, there is proposed a method of measuring/testing the insulation resistance of the capacitor one by one via a plurality of charging portions connected to the current-limiting resistance, at a state of applying the measuring voltage to the capacitor for a predetermined time. However, since the measuring voltage has to be applied to the work for a long time, the method is not suitable for the test in mass production.

The present invention has been developed in consideration of this respect, and an object thereof is to provide a method of measuring insulation resistance of the capacitor and an insulation resistance measuring apparatus of the capacitor, in which an insulation resistance of the capacitor can easily, quickly and precisely be measured.

SUMMARY OF THE INVENTION

According to the present invention, there is provided a method of measuring an insulation resistance of an capacitor, comprising:

a step of intermittently applying a constant voltage to the capacitor, and intermittently measuring a current flowing through said capacitor; and a step of intermittently detecting a value of the insulation resistance of said capacitor based on values of the measured current and the applied constant voltage.

Furthermore, there is provided an insulation resistance measuring apparatus, comprising:

a power source for intermittently applying a constant voltage to a capacitor;

current measuring means for intermittently measuring a current flowing through said capacitor while applying the constant voltage to said capacitor;

resistance measuring means for intermittently detecting an insulation resistance of said capacitor based on the measured current value and the constant voltage value; and comparing means for comparing defective/non-defective of said capacitor based on the insulation resistance detected by said resistance measuring means.

BRIEF DESCRIPTION OF THE DRAWINGS

FIG. 1 is a block diagram showing a schematic configuration of an insulation resistance measurement apparatus of an capacitor according to the present invention.

FIG. 2 is a diagram showing a change by time of a resistance value of the capacitor in the case in which a DC voltage is continuously applied to the capacitor.

DESCRIPTION OF THE PREFERRED EMBODIMENTS

A method of measuring insulation resistance of a capacitor and an insulation resistance measuring apparatus of the capacitor will more specifically be described hereinafter with reference to the drawings.

FIG. 1 is a block diagram showing a schematic configuration of an insulation resistance measurement apparatus of an capacitor according to the present invention. Before explanation of the block diagram, a principle of the present embodiment will first be described.

The present applicant has found a technique in which in the case of intermittently applying a DC voltage to the capacitor, an insulation resistance of the capacitor can be measured with a precision similar to the precision in the case of continuously applying the DC voltage.

Figure 3:
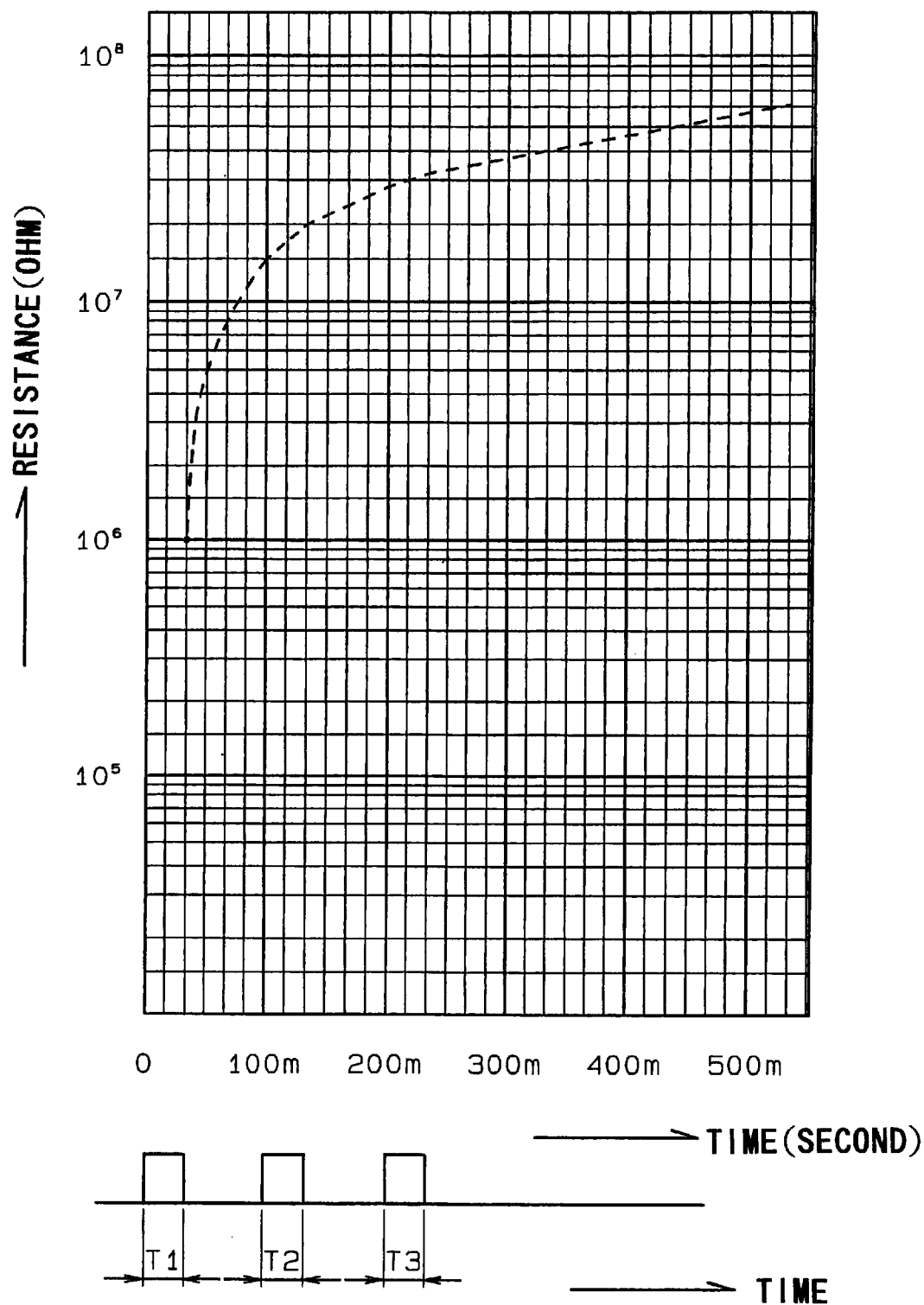
FIG. 3 is a diagram showing the change by time of the resistance value of the capacitor in the case in which the DC voltage is intermittently applied to the capacitor.

FIG. 2 is one example of a diagram showing a change by time of a resistance value of the capacitor in the case in which the DC voltage is continuously applied to the capacitor, and FIG. 3 is one example of a diagram showing the change by time of the resistance value of the capacitor in the case in which the DC voltage is intermittently applied to the capacitor. When the DC voltage is continuously applied, the capacitor substantially becomes equal to a short-circuit state, and enters a constant current state during the lapse of a predetermined period from when beginning to apply the DC voltage. After the lapse of the predetermined period, the constant current state changes to a constant voltage state. Moreover, as shown in FIG. 2, dielectric polarization proceeds and the insulation resistance value rises with an insulation resistance property having a certain inclination.

On the other hand, when the DC voltage is intermittently applied, as shown in FIG. 3, an initial insulation resistance value sometimes includes a transient state, and does not necessarily become equal to a measured value of insulation resistance in the case of continuously applying the DC voltage. However, second and third insulation resistance values at second and third measuring times become equal to the insulation resistance value in the case of continuously applying the DC voltage. This is because the dielectric polarization proceeds and the insulation resistance value rises with the insulation resistance property having the certain inclination similarly as the case of continuously applying the DC voltage.

Additionally, T1, T2, T3 of FIG. 3 show a period of applying the voltage. These T1, T2, T3 do not necessarily have the same time interval.

In the present embodiment, a constant voltage similar to the case of continuously applying the voltage is intermittently applied to the capacitor, and the insulation resistance is measured in the same way as the case of continuously applying the voltage. Moreover, in the present embodiment, a constant-voltage applying method is employed instead of a conventional resistance charging method, and the insulation resistance value is measured immediately after the lapse of a constant current period immediately after applying of the voltage. In the constant-voltage applying method, a time constant based on a current-limiting resistance value and capacitance value such as the resistance charging method does not exist. A voltage rising time immediately after the lapse of the constant current period immediately after applying of the voltage can be ignored, and therefore the insulation resistance during constant voltage can exactly be measured.

Figure 4:
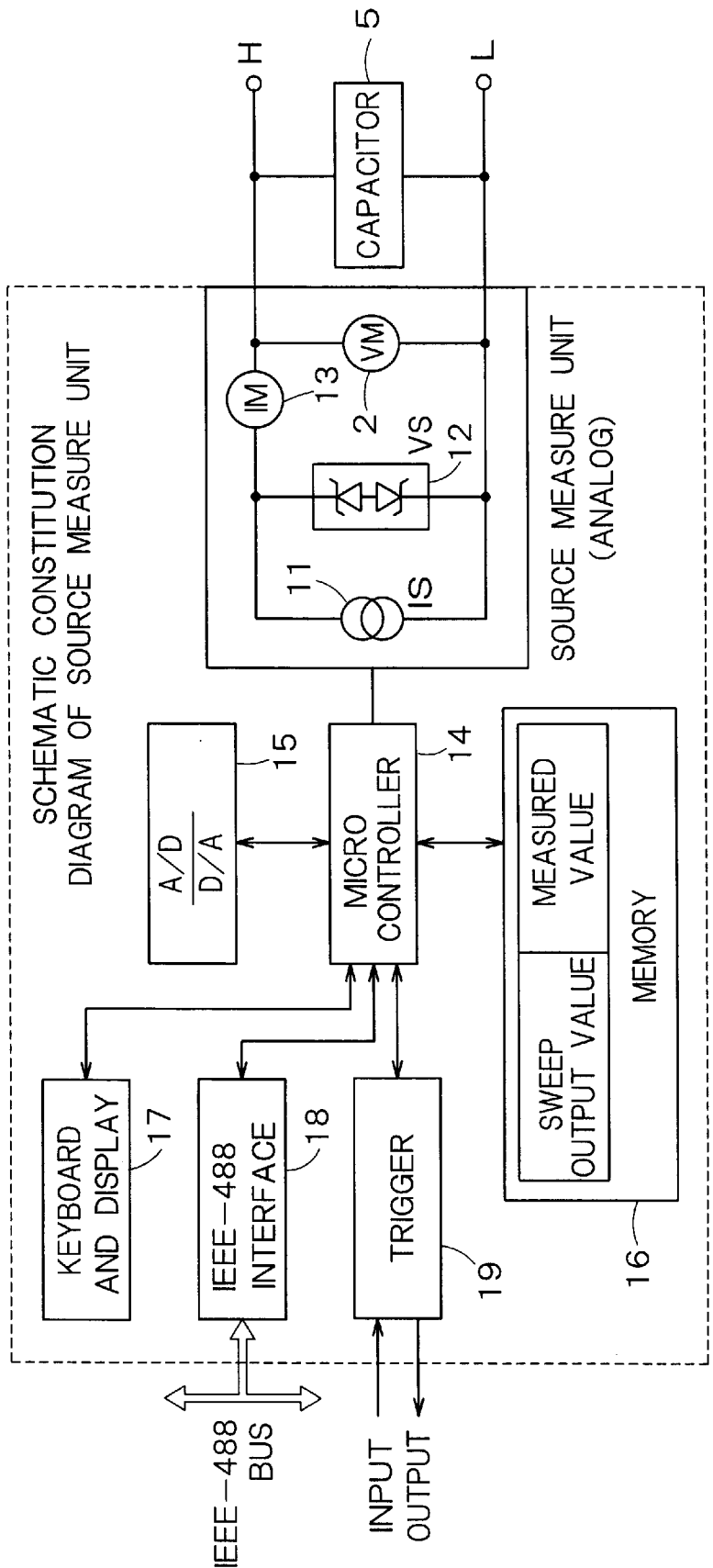
FIG. 4 is a block diagram showing a schematic configuration of a source measure unit.

As a technique of measuring the insulation resistance of the capacitor in the constant-voltage applying method, there are cases of using an insulation resistance intermittent applying/measuring circuit showing in FIG. 1 and a source measure unit showing in FIG. 4.

The insulation resistance intermittent applying/measuring circuit of FIG. 1 includes a variable/constant-voltage power source 1, a voltmeter 2, an intermittent circuit and constant-current supply (source) circuit 3, a constant-current sink circuit 4, a test capacitor 5, a current amplifier 6, an A/D converter and calculation processor 7, and a comparing section 8 for comparing whether or not the insulation resistance value of the test capacitor 5 calculated by the A/D converter and calculation processor 7 is normal.

The intermittent circuit and constant-current supply (source) circuit 3 of FIG. 1 intermittently outputs the current based on the voltage supplied from the variable/constant-voltage power source 1. The constant-current sink circuit 4 takes in the current flowing through the circuit, when the test capacitor 5 is brought to a constant-voltage state. The current flowing through the test capacitor 5 is amplified by the current amplifier 6 and supplied to the A/D converter and calculation processor 7.

The A/D converter and calculation processor 7 converts an analog current measured value to a digital measured value, carries out a calculation processing and outputs the insulation resistance value.

When the DC voltage is intermittently applied, there is a correlation between the insulation resistance value after a predetermined time in the case of continuously applying the DC voltage and the insulation resistance value in the case of intermittently applying the DC voltage. Therefore, it is possible to compare whether or not the insulation resistance is normal based on the insulation resistance value detected by measuring the constant voltage intermittently applied for a short time.

On the other hand, a source measure unit of FIG. 4 includes a current source 11, a voltage clamp circuit 12, an ammeter 13 and the voltmeter 2. The voltage clamp circuit 12, voltmeter 2 and test capacitor 5 are connected in parallel with the current source 11.

A current value outputted from the current source 11 is controlled by a micro controller 14. Moreover, the current flowing through the test capacitor 5 is input to the micro controller 14 via an A/D & D/A converter 15. The micro controller 14 calculates the insulation resistance of the test capacitor 5, and stores the calculation result in a memory 16.

Additionally, the micro controller 14 is connected to a keyboard for inputting a measurement condition, a display 17 for displaying the measurement result, an interface 18 with an IEEE-488 bus, and a trigger input/output section 19.

Figure 5:
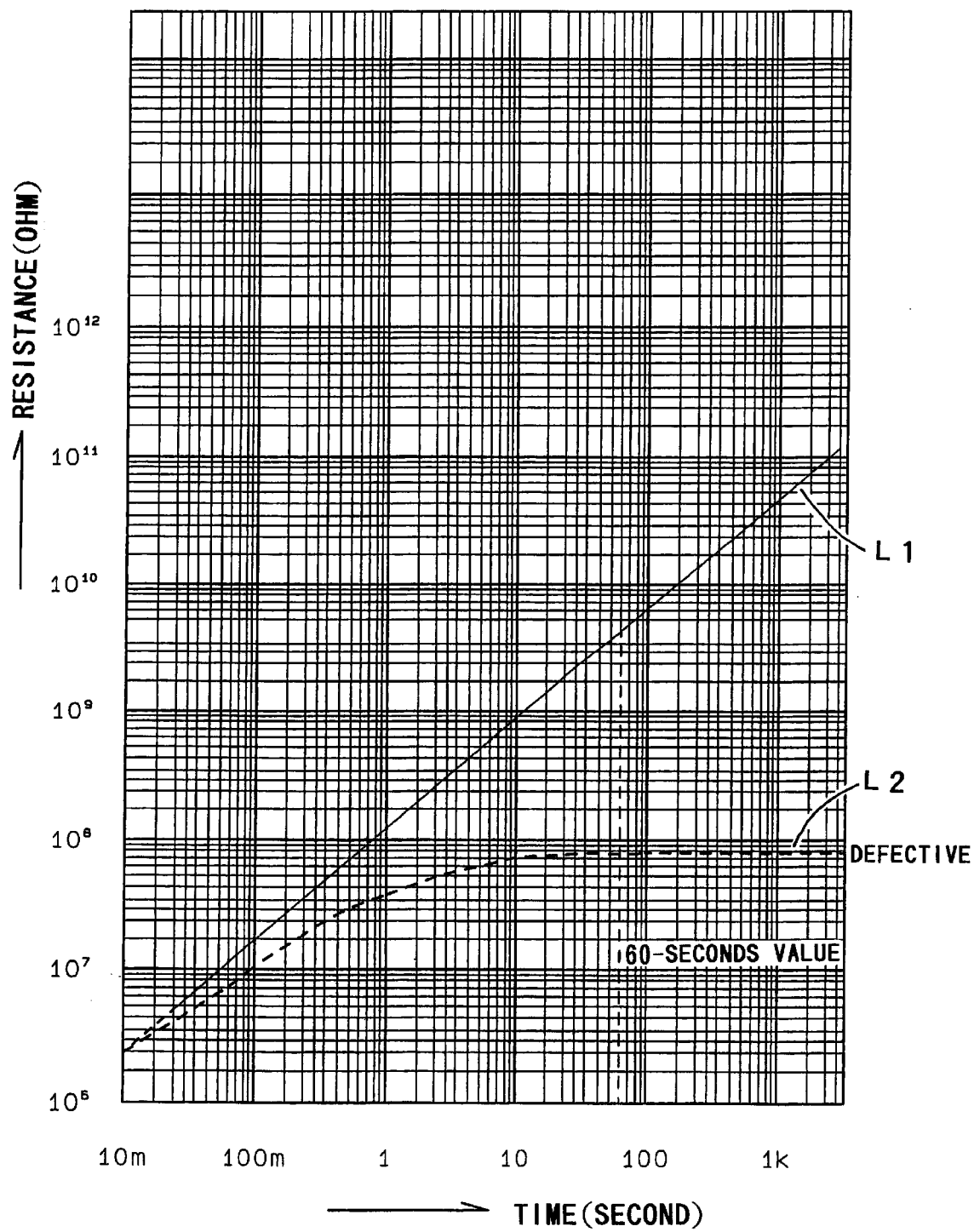
FIG. 5 shows a diagram showing an insulation resistance property of a non-defective by a solid line L1, and the insulation resistance property of a defective by a dotted line L2.

FIG. 5 shows one example of an insulation resistance property of a non-defective by a solid line L1, and the insulation resistance property of a defective by a dotted line L2. For the test capacitor 5 whose insulation resistance value after the lapse of the predetermined time, that is, 60-seconds value is normal, defective/non-defective can easily be compared after a continuous applying period of the DC voltage, for example, a 200-milliseconds value.

Figure 6:
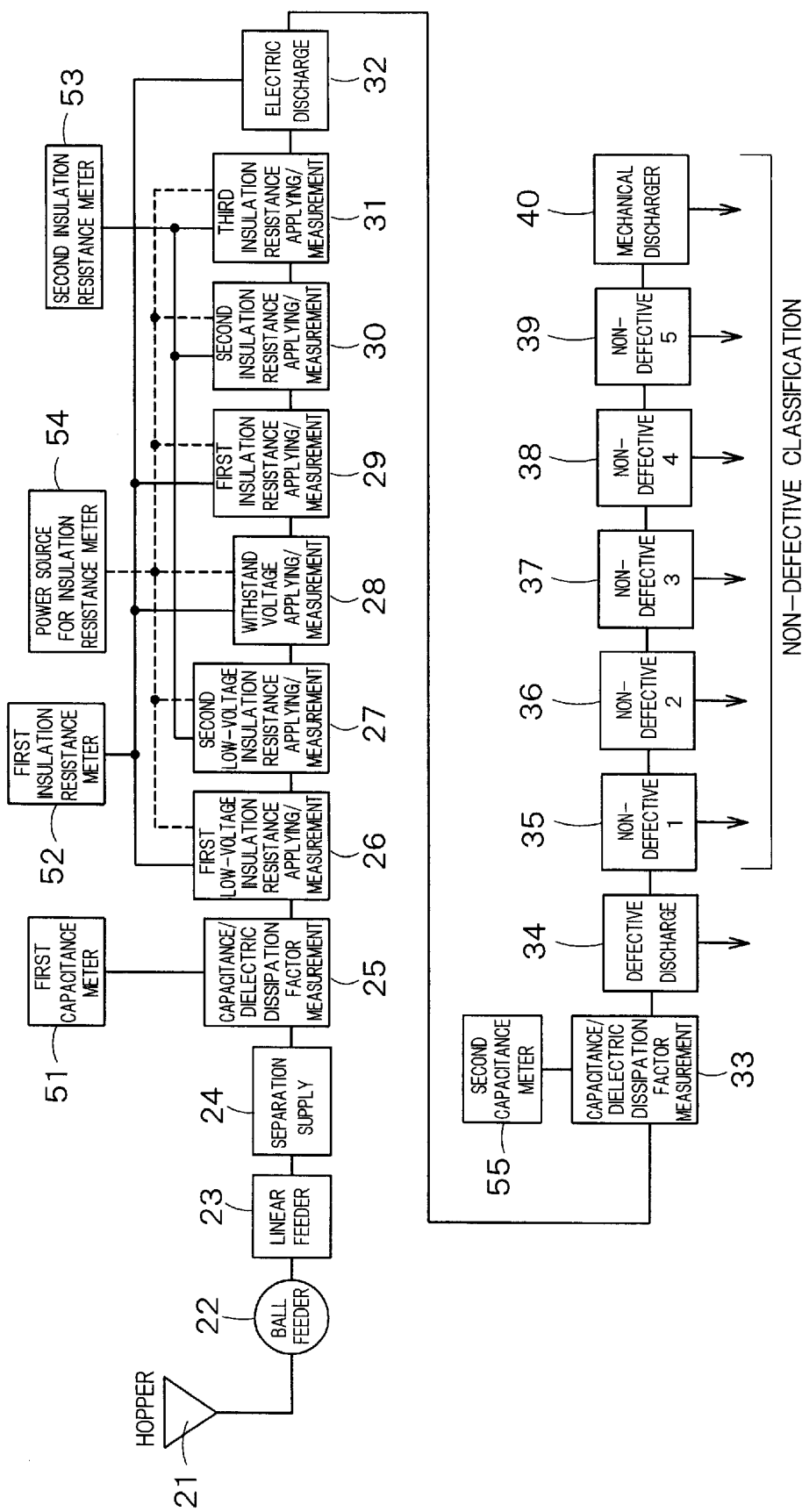
FIG. 6 is a processing flowchart of a measurement apparatus for the capacitor for applying, measuring and comparing a voltage only having a single polarity, that is, a positive polarity.

FIG. 6 is one example of a processing flowchart of a measurement apparatus for the capacitor for applying, measuring and comparing a voltage having only a single polarity, that is, a positive polarity. Examples of use of the apparatus of FIG. 6 include a polar capacitor (tantalum electrolytic capacitor, aluminum electrolytic capacitor, and the like), a non-polar general capacitor (general-purpose multi layer ceramic capacitor, and the like), and the like.

Figure 7:
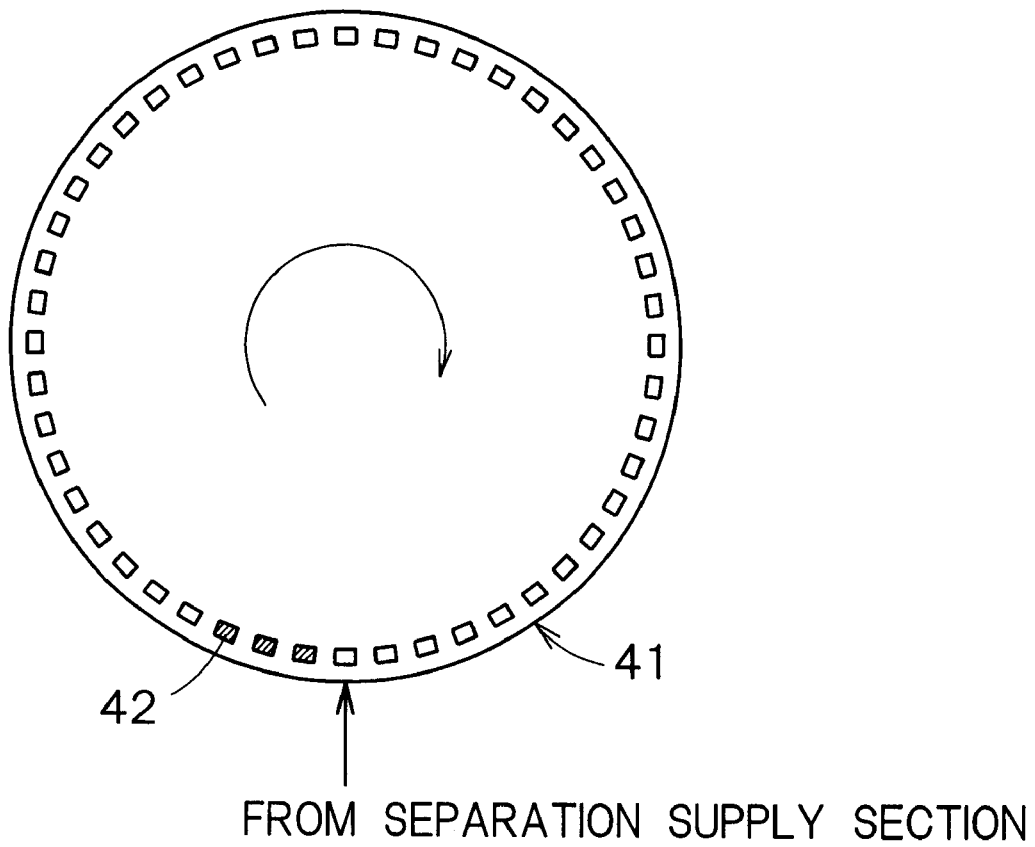
FIG. 7 is a diagram showing one example of a structure of a turntable.

The test capacitor 5 is supplied through a hopper 21, ball feeder 22, linear feeder 23, and separation supply section 24, to a work-pocket 42 in a turntable 41 shown in FIG. 7. Here, the work-pocket 42 is formed by passing an outer peripheral unit of the disc-shaped turntable 41 through an axial direction of the turntable 41.

The turntable 41 to which the test capacitor 5 is supplied performs intermittent rotation for rotating and stopping by every disposed pitch of the work-pocket 42 at a high speed.

First of all, a capacitance and dielectric dissipation factor of the test capacitor 5 (reference numeral 25) is measured during the intermittent rotation of the turntable 41. Subsequently, a first low-voltage insulation resistance of the test capacitor 5 (numeral 26) is measured by using a first insulation resistance meter 52. Subsequently, a second low-voltage insulation resistance of the test capacitor 5 (numeral 27) is measured by using a second insulation resistance meter 53. During measurement of the first and second low-voltage insulation resistance, a power source 54 for the insulation resistance meter applies to the test capacitor 5 a voltage, for example, of 1 to 10 volts.

Here, the first and second insulation resistance meters 52 and 53 of FIG. 6 are composed of the insulation resistance intermittent applying/measuring circuit shown in FIG. 1, or the source measure unit shown in FIG. 4.

Subsequently, a withstand voltage of the test capacitor 5 (numeral 28) is measured by using the first insulation resistance meter 52. Here, depending upon use, the power source 54 for the insulation resistance meter applies to the test capacitor 5 the voltage, for example, of 700 volts at maximum.

Subsequently, the first insulation resistance of the test capacitor 5 (numeral 29) is measured by using the first insulation resistance meter 52. Subsequently, the second insulation resistance of the test capacitor 5 (numeral 30) is measured by using the second insulation resistance meter 53. Subsequently, a third insulation resistance of the test capacitor 5 (numeral 31) is measured by using the second insulation resistance meter 53. During measurement of the first to third insulation resistance, depending upon the use, the power source 54 for the insulation resistance meter applies to the test capacitor 5 the voltage, for example, of 700 volts at maximum.

Subsequently, the test capacitor 5 is discharged (numeral 32), the discharged current is measured, and thereby the insulation resistance is measured by using the first insulation resistance meter 52. Subsequently, the capacitance and dielectric dissipation factor of the test capacitor 5 (numeral 33) is measured by using a second capacitance meter 55.

Additionally, the test capacitor 5 is not discharged after measuring the second low-voltage insulation resistance until when measuring the withstand voltage. Similarly, the test capacitor 5 is not discharged after measuring the withstand voltage until when measuring the measurement of the first insulation resistance.

Usually, a withstand-voltage measurement voltage is set to be higher than an insulation measurement voltage. Moreover, when measuring the first insulation resistance, after the constant-current sink circuit 4 operates, at the time when a constant-voltage state is obtained, the insulation resistance is measured.

For a reason why the low-voltage insulation resistance is measured twice, for example, after measurement of capacitance/dielectric dissipation factor of 1 kHz, 1 Vrms with the first capacitance meter 51, a residual charge of ±1.4 volts at maximum remains in the test capacitor 5. The measured value of the first low-voltage insulation resistance is mainly used in detection of dispersion/short-circuit.

After the measurement of the capacitance and dielectric dissipation factor of FIG. 6 has been completed, defectives are discharged (numeral 34), and non-defectives are sorted by types and discharged (numerals 35 to 40).

Figure 8:
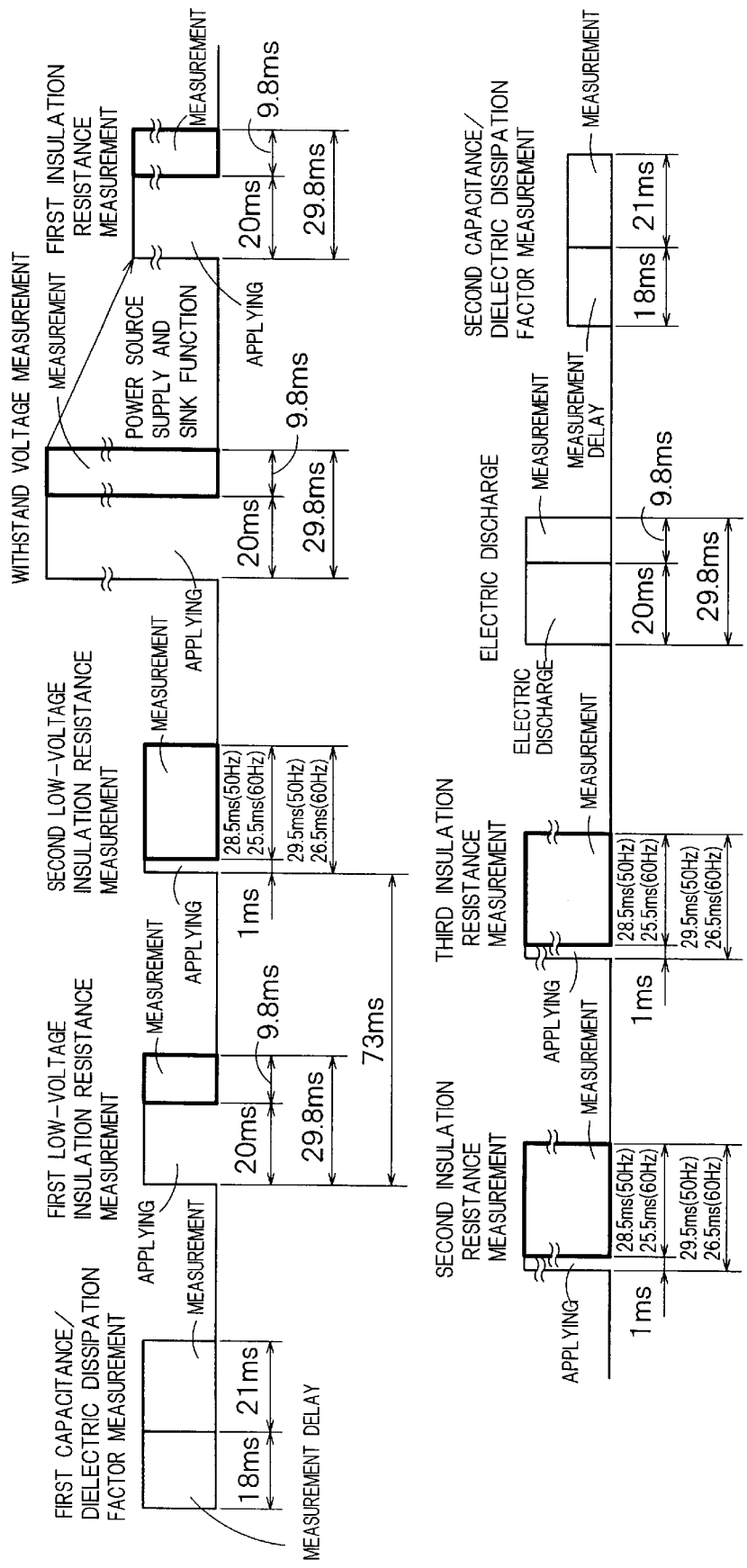
FIG. 8 is a diagram showing one example of a measurement timing of FIG. 6.

FIG. 8 is a diagram showing one example of a measurement timing of FIG. 6. In FIG. 8, the abscissa indicates a time, and the ordinate indicates a voltage value. As shown in FIG. 8, when measuring the second low-voltage insulation resistance, a period for applying the voltage is shorter than that of the case of measuring the first low-voltage insulation resistance. Moreover, the time for applying the voltage at the second and third insulation resistance measuring times is shorter than the time for applying the voltage at the first insulation resistance measuring time.

Furthermore, a voltage applied during the withstand voltage measurement is set higher than that of the first to third insulation resistance measurement.

Figure 9:
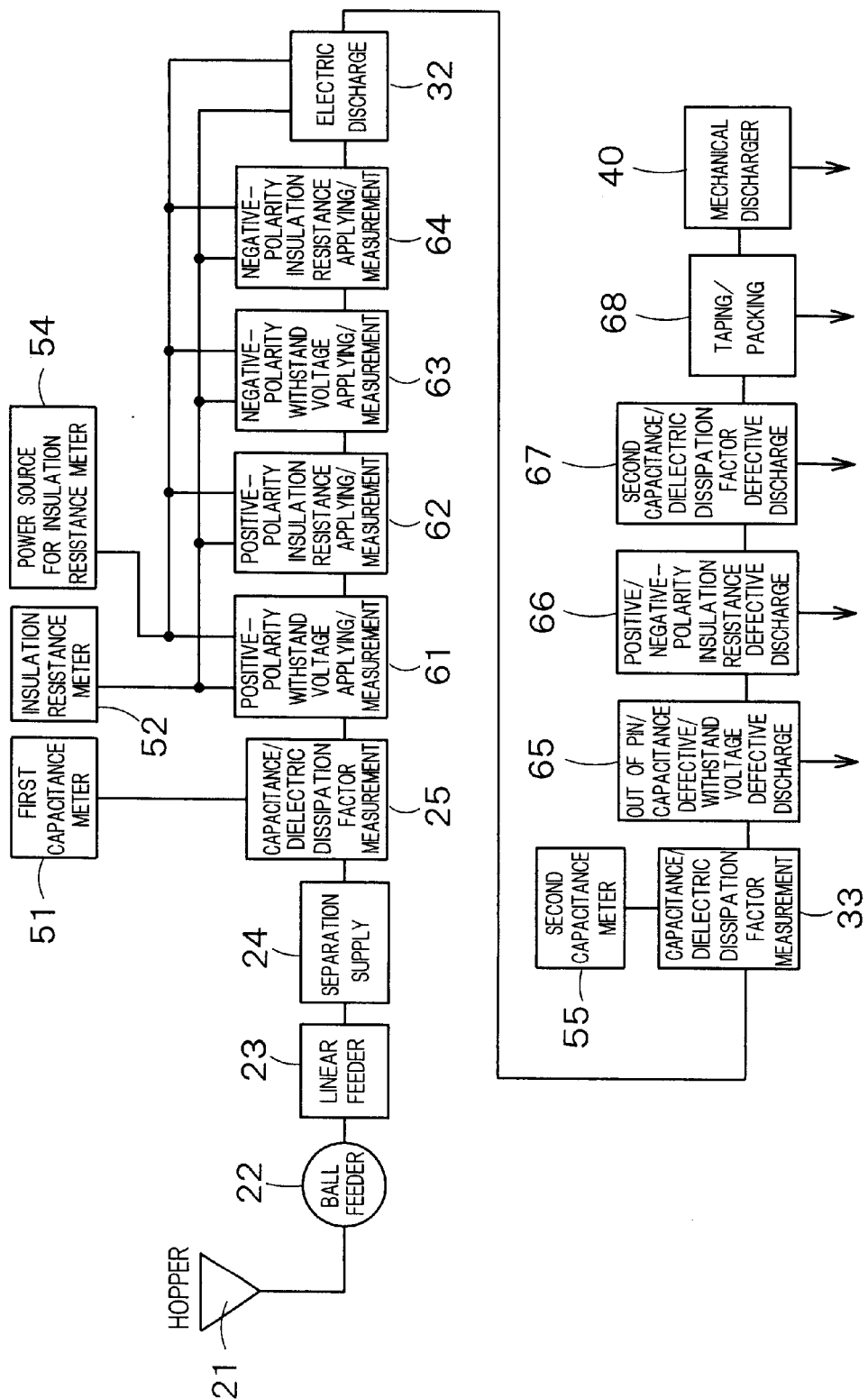
FIG. 9 is a processing flowchart of the measurement apparatus for the capacitor for applying, measuring and comparing a bipolar voltage.

On the other hand, FIG. 9 is one example of a processing flowchart of the measurement apparatus for the capacitor for applying, measuring and comparing a bipolar voltage, and shows a processing up to taping/packing. In the processing flow of FIG. 9, the bipolar voltage having both positive and negative polarities is applied to measure the withstand voltage and insulation resistance. Examples of the use of the apparatus of FIG. 9 include a multi layer ceramic capacitor to be mounted on a surface having a relatively small capacity (1 $\mu$F or less), and the insulation resistance is measured once for each polarity. Additionally, in FIG. 9, the processing and configuration similar to those of FIG. 6 are denoted with the same reference numerals.

In the measurement apparatus for the capacitor of FIG. 9, after the positive-polarity withstand voltage and insulation resistance is measured (numerals 61, 62), the negative-polarity withstand voltage and insulation resistance is measured (numerals 63, 64). Subsequently, after the test capacitor 5 is discharged (numeral 32), the capacitance and dielectric dissipation factor are measured (numeral 33). Subsequently, after the defectives are discharged (numerals 65 to 67), the non-defectives are taped/packed (numeral 68), and discharged (numeral 40).

As shown in FIG. 9, as an effect of the case of applying the bipolar voltage, dielectric polarization is neutralized, no residual charge remains, and any problem by the residual charge is not caused even during taping/packing. Moreover, the defective having abnormality in the insulation resistance value for only a certain polarity can easily be detected.

Figure 10:
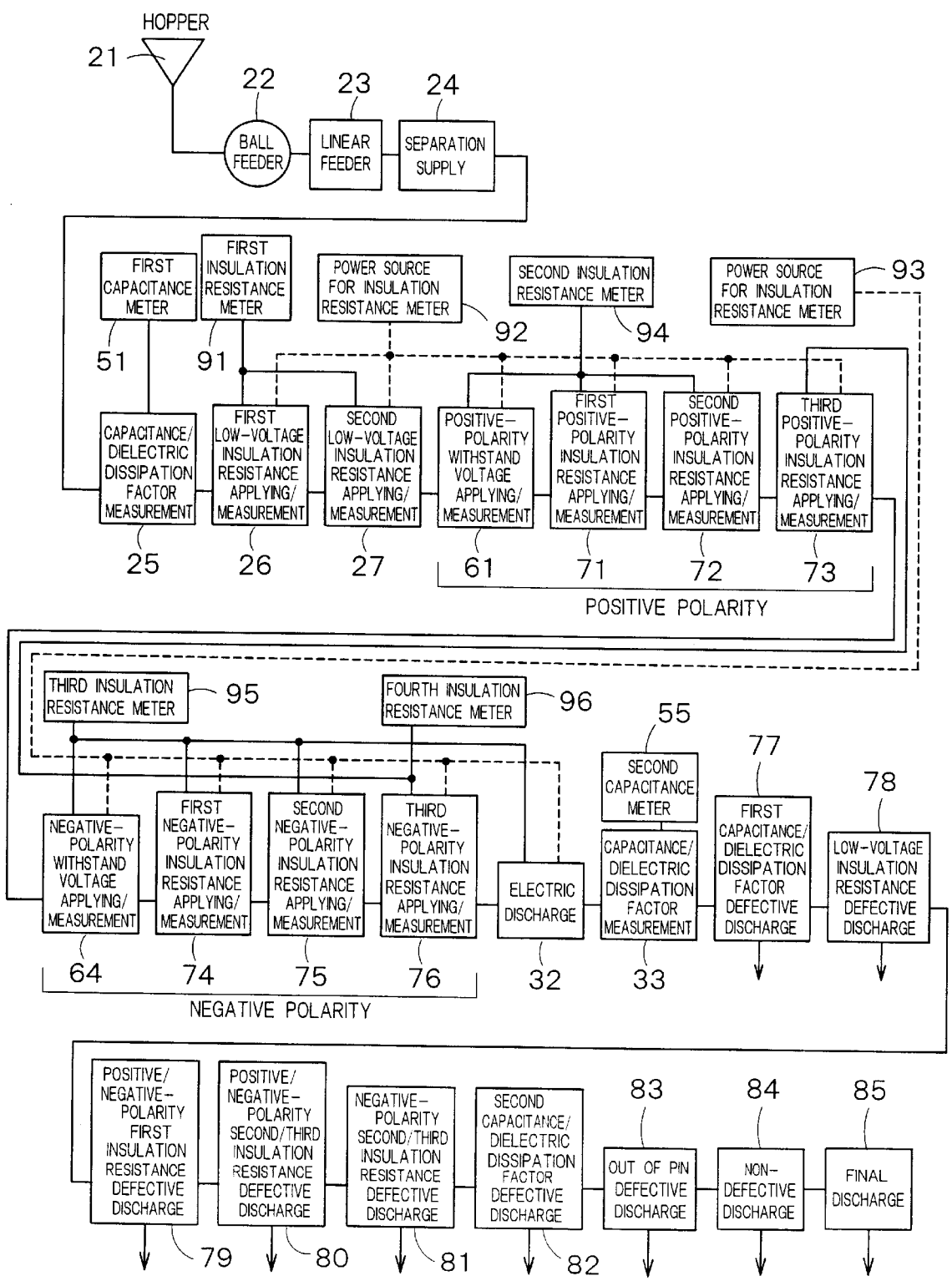
FIG. 10 is a processing flowchart of the measurement apparatus for the capacitor for applying and measuring the bipolar voltage.

FIG. 10 is one example of a processing flowchart of the measurement apparatus for the capacitor for applying and measuring the bipolar voltage. Examples of use of the apparatus of FIG. 10 include a non-polar capacitor, particularly a multi layer ceramic capacitor having a large capacity of 1 $\mu$F or more. Additionally, the apparatus can also be utilized in the measurement of a non-polar laminated film capacitor.

In the measurement apparatus for the capacitor of FIG. 10, after measuring the first and second low-voltage insulation resistance (numerals 26, 27), a positive-polarity low voltage is applied to the test capacitor 5 to measure a positive-polarity withstand voltage (numeral 61) and first to third positive-polarity insulation resistance (numerals 71 to 73) in order. The positive-polarity withstand voltage, and the first and second positive-polarity insulation resistance are measured using a second insulation resistance meter 94, and the third positive-polarity insulation resistance is measured by using a third insulation resistance meter 95.

Subsequently, a negative-polarity constant voltage is applied to the test capacitor 5, and the negative-polarity withstand voltage (numeral 64), and first to third negative-polarity insulation resistance (numerals 74 to 76) are measured in order. Subsequently, after the test capacitor 5 is discharged (numeral 32), the capacitance and dielectric dissipation factor of the test capacitor 5 (numeral 33) is measured by using the second capacitance meter 55.

Subsequently, respective steps are performed in order: first discharge of a defective of the capacitance/dielectric dissipation factor (numeral 77); discharge of the defective of the low-voltage insulation resistance (numeral 78); first discharge of the defective of the positive/negative-polarity insulation resistance (numeral 79); second and third discharges of the defective of the positive-polarity insulation resistance (numeral 80); second and third discharges of the defective of the negative-polarity insulation resistance (numeral 81); second discharge of the defective of the capacitance/dielectric dissipation factor (numeral 82); discharge of a defective pin (numeral 83); discharge of a non-defective (numeral 84); and final discharge (numeral 85).

Figure 11:
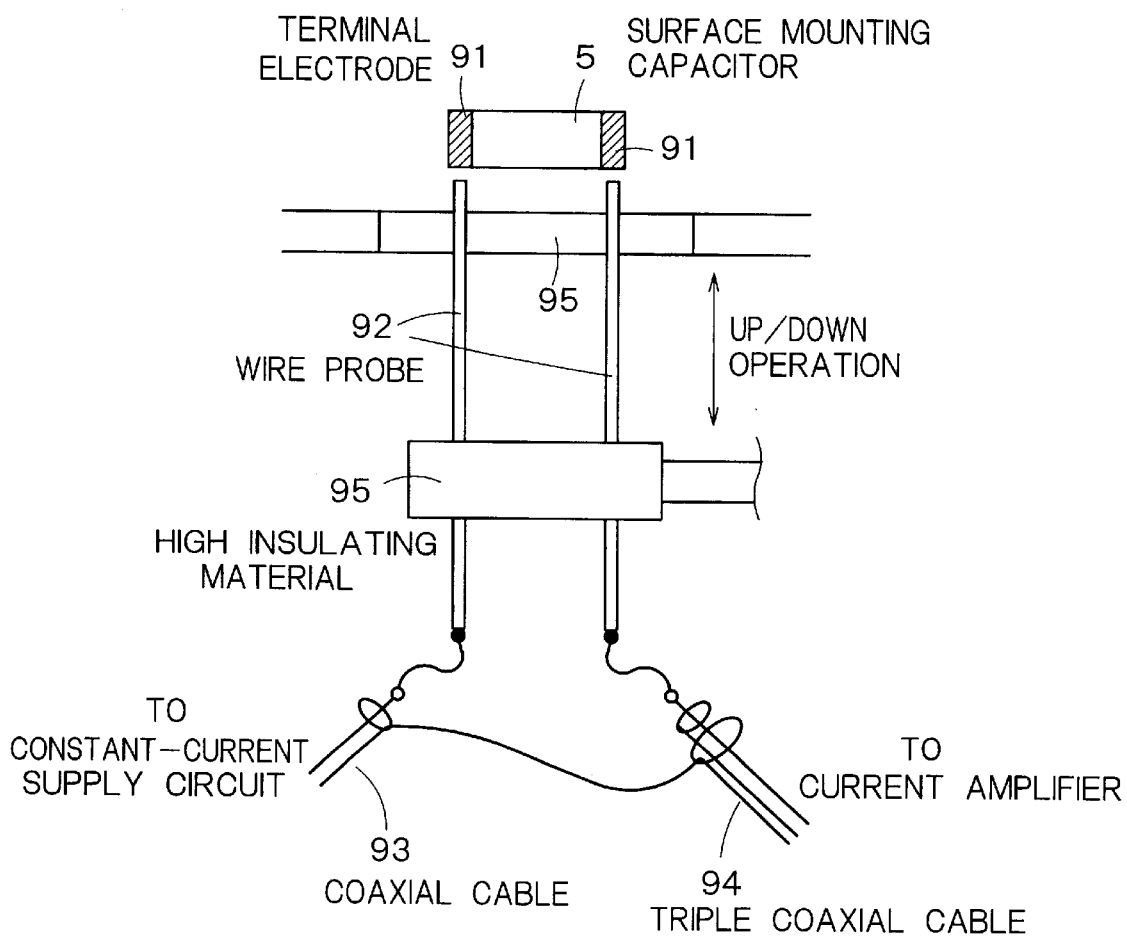
FIG. 11 is an enlarged view showing a structure of a probe electrode unit of the measurement apparatus for the capacitor shown in FIGS. 6, 9 and 10.

FIG. 11 is one example of an enlarged view showing a structure of a probe unit of the measurement apparatus for the capacitor showing in FIGS. 6, 9 and 10, and shows that a measuring probe (wire probe) 92 for applying the voltage is contacted with a terminal electrode 91 of the surface mounting capacitor 5. One end of the measuring probe 92 is contacted the terminal electrode 91, and the other end thereof is connected to the intermittent circuit and constant-current supply circuit 3 and current amplifier 6 of FIG. 1 via coaxial circuits 93, 94, respectively. Moreover, the capacitor 5 is laid on an upper surface of a high insulating material 95, and the high insulating material 95 is also disposed in the vicinity of a middle between the one and other ends of the measuring probe 92.

As shown in FIG. 11, the measuring probe 92 is not shielded, and no guard electrode exists. A reason why the shield and guard electrode are unnecessary is that the constant-voltage power source is used and an equivalent impedance on a power source side substantially becomes zero. Moreover, since the current amplifier 6 having a low-input impedance is used, the system is not easily influenced by external disturbance, and an ultrahigh resistance value can practically be measured/reproduced. According to the present embodiment, measurement in tera-ohms is actually possible.

Figure 12:
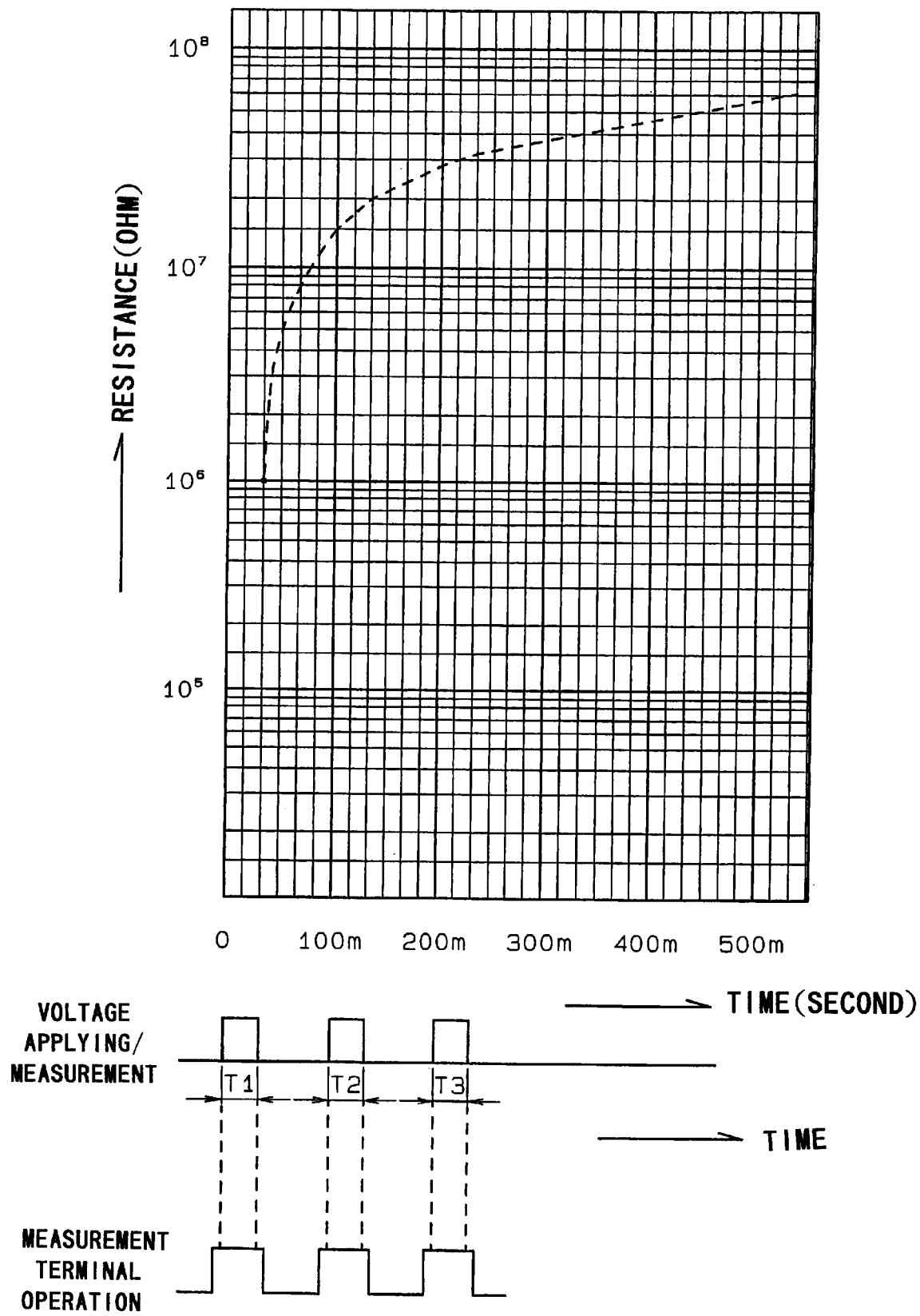
FIG. 12 is a diagram showing a relation between the voltage of a measuring probe and a timing of applying the voltage to the test capacitor.

FIG. 12 is a diagram showing a relation between the voltage of the measuring probe 92 and an applying timing of the voltage to the test capacitor 5. As shown in the drawing, after the measuring probe 92 steadily contacts the terminal electrode 91 of the test capacitor 5, the voltage is applied to the test capacitor 5 and measured. Subsequently, after the applying and measurement of the voltage is completed, the measuring probe 92 is detached from the terminal electrode 91 of the capacitor 5. Then, the measuring probe 92 can be protected from a spark and the like, and life of the measuring probe 92 can be lengthened.

Figure 13:
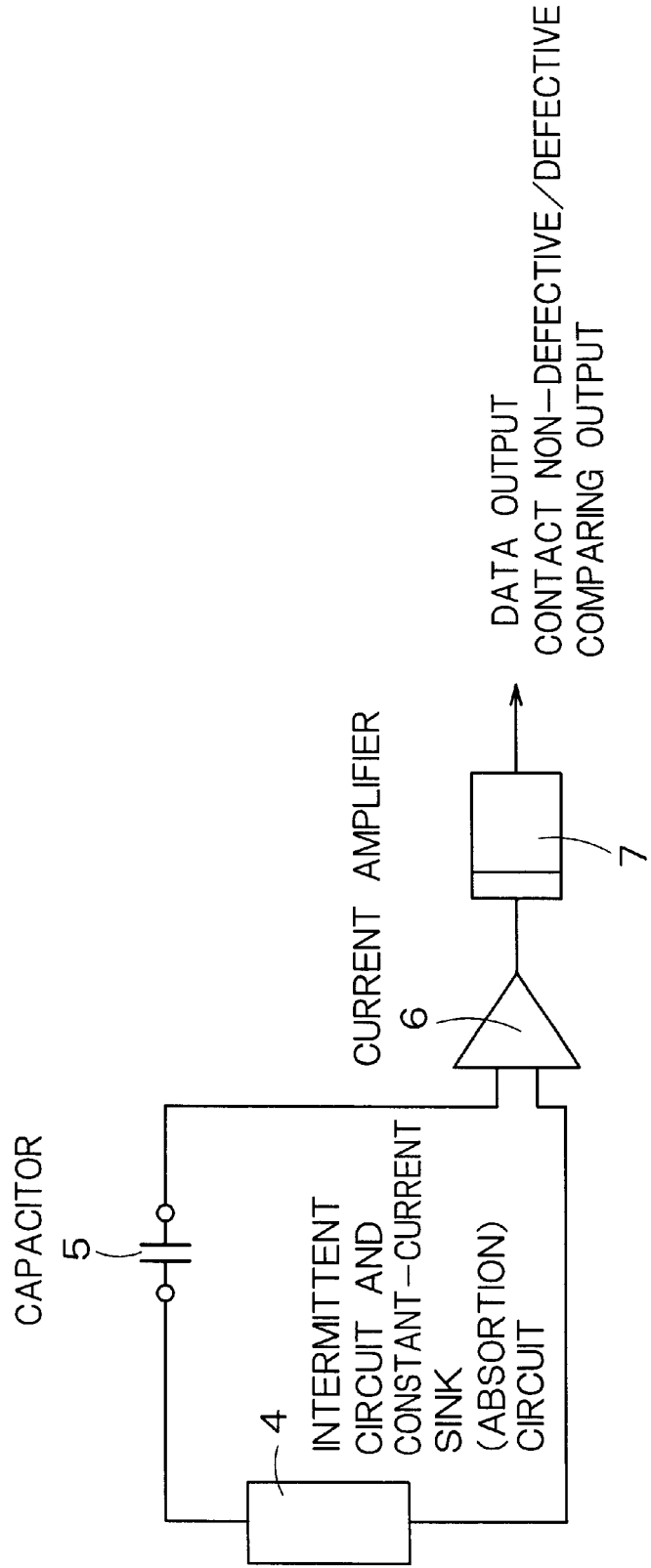
FIG. 13 is a block diagram showing a detailed configuration of an electric discharge portion of FIGS. 6, 9 and 10.

FIG. 13 is a block diagram showing a detailed configuration of the electric discharge portion 32 of FIGS. 6, 9 and 10. As shown in the drawing, the electric discharge portion 32 is composed of omitting the variable/constant-voltage power source 1, and intermittent circuit and constant-current supply circuit 3 from the insulation resistance intermittent applying/measuring circuit of FIG. 1. When the capacitor 5 is discharged, first of all, the constant-current state is obtained, and a discharge current is reduced in a short time. According to the embodiment of the present invention, it is possible to compare whether or not the discharge is completed based on the resistance measured based on the voltage during the measurement of insulation resistance. Simultaneously, a contact state of the measuring probe 92 can also be compared.

What is claimed is:

1. A method of measuring an insulation resistance of a capacitor, comprising:

a step of intermittently applying a constant voltage to the capacitor by a power supply, and intermittently measuring a current flowing through said capacitor;

a step of intermittently detecting a value of the insulation resistance of said capacitor based on values of the measured current and the applied constant voltage; and a step of discharging a charged electric charge of said capacitor in sync with the intermittent applying of the constant voltage for said capacitor by said power supply.

2. The method of measuring the insulation resistance of the capacitor according to claim 1, wherein the insulation resistance of said capacitor is detected after the intermittent applying of the voltage to said capacitor is begun, when a voltage between both ends of said capacitor becomes a constant voltage.

3. The method of measuring the insulation resistance of the capacitor according to claim 1, wherein the insulation resistance of said capacitor is intermittently detected, while intermittently applying to said capacitor the constant voltage with only either of positive or negative polarity.

4. The method of measuring the insulation resistance of the capacitor according to claim 1, wherein the insulation resistance of said capacitor is intermittently detected, while intermittently applying to said capacitor the constant voltages with both of positive and negative polarities.

5. The method of measuring the insulation resistance of the capacitor according to claims 1, wherein the insulation resistance of said capacitor is intermittently measured, while intermittently applying to said capacitor the constant voltage of which voltage level is equal.

6. The method of measuring the insulation resistance of the capacitor according to claims 1, wherein the insulation resistance of said capacitor is intermittently detected, while intermittently applying to said capacitor the constant voltages of which voltage levels are different from each other.

7. The method of measuring the insulation resistance of the capacitor according to claims 1, wherein the constant voltage is intermittently applied to said capacitor after a measuring probe for applying the constant voltage is contacted with an electrode terminal of said capacitor, and said measuring probe is disconnected from the electrode terminal of said capacitor after the measurement of current flowing through said capacitor is completed.

8. An insulation resistance measuring apparatus, comprising:

a power source for intermittently applying a constant voltage to a capacitor;

current measuring means for intermittently measuring a current flowing through said capacitor while applying the constant voltage to said capacitor;

resistance measuring means for intermittently detecting an insulation resistance of said capacitor based on the measured current value and the constant voltage value;

comparing means for comparing defective/non-defective of said capacitor based on the insulation resistance detected by said resistance measuring means; and discharge means for discharging a charged electric charge in said capacitor charged by the intermittent applying of the constant voltage, said discharge means allowing the charged electric charge to discharge the charged electric charge in said capacitor in sync with the intermittent applying of the constant voltage for said capacitor by said power source.

9. The insulation resistance measurement apparatus of the capacitor according to claim 8 wherein the insulation resistance means detect the insulation resistance of said capacitor after said power source begins the intermittent applying of the voltage to said capacitor, when voltage between both ends of said capacitor becomes the constant voltage.

10. The insulation resistance measurement apparatus of the capacitor according to claim 8, further comprising current sinking means for sinking the current so that no current flows through said capacitor, after voltages of both ends of said capacitor become the constant voltage.

11. The insulation resistance measurement apparatus according to claim 8, wherein a measuring probe for applying the voltage connected with an electrode terminal of said capacitor has a structure without any shield and guard electrode.

12. The insulation resistance measurement apparatus according to claim 8, wherein said current measuring means measure the current flowing when said discharge means discharge the charged electric charge in said capacitor, and said comparing means compare whether or not said capacitor is defective, based on the constant voltage value finally applied to said capacitor and the current value measured by said current measuring means at the time.

13. The insulation resistance measurement apparatus according to claim 8, wherein said resistance measuring means intermittently detect the insulation resistance of said capacitor, when said power source applies to said capacitor the constant voltage with only either of positive or negative polarity.

14. The insulation resistance measurement apparatus of the capacitor according to claim 8, wherein said resistance measuring means intermittently detect the insulation resistance when said power source intermittently applies to said capacitor the constant voltage of which voltage level is equal.

15. The insulation resistance measurement apparatus of the capacitor according to claim 8, wherein said resistance measuring means intermittently detect the insulation resistance when said power source intermittently applies to said capacitor the constant voltages of which voltage levels are different from each other.

16. The insulation resistance measurement apparatus of the capacitor according to claim 8, wherein said power source intermittently applies the constant voltage to said capacitor after allowing an electrode terminal of said capacitor to contact with a measuring probe for applying the constant voltage, and said resistance measuring means disconnect said measuring probe from the electrode terminal of said capacitor, after the measurement of the current flowing through said capacitor is completed.

* * * * *